United States Patent
Hanafi et al.

(10) Patent No.: US 6,835,614 B2
(45) Date of Patent: Dec. 28, 2004

(54) DAMASCENE DOUBLE-GATE MOSFET WITH VERTICAL CHANNEL REGIONS

(75) Inventors: Hussein I. Hanafi, Basking Ridge, NJ (US); Jeffrey J. Brown, Fishkill, NY (US); Wesley C. Natzle, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/609,815

(22) Filed: Jun. 30, 2003

(65) Prior Publication Data

US 2004/0092067 A1 May 13, 2004

Related U.S. Application Data

(62) Division of application No. 09/866,023, filed on May 24, 2001, now Pat. No. 6,635,923.

(51) Int. Cl.$^7$ .......................................... H01L 21/8238
(52) U.S. Cl. ..................... 438/212; 438/149; 438/479
(58) Field of Search ................................. 438/149, 212, 438/296, 299, 479, 517, 585, 589, 592; 257/327, 329, 333, 347, 350, 351, 360, 401

(56) References Cited

U.S. PATENT DOCUMENTS

| | | | |
|---|---|---|---|
| 5,503,882 A | * | 4/1996 | Dawson ...................... 438/763 |
| 5,751,631 A | | 5/1998 | Liu et al. |
| 6,040,214 A | | 3/2000 | Boyd et al. |
| 6,054,355 A | * | 4/2000 | Inumiya et al. ............. 438/296 |
| 6,075,272 A | * | 6/2000 | Forbes et al. ............... 257/378 |
| 6,143,635 A | | 11/2000 | Boyd et al. |
| 6,284,613 B1 | * | 9/2001 | Subrahmanyam et al. .. 438/307 |

OTHER PUBLICATIONS

Yan, et al. "Scaling the MOSFET: From Bulk to SOI to Bulk", IEEE Trans. Elect. Dev., vol. 39, p. 1704, Jul. 1992.

* cited by examiner

*Primary Examiner*—Ori Nadav
(74) *Attorney, Agent, or Firm*—Scully, Scott, Murphy, & Presser; Wan Yee Cheung, Esq.

(57) ABSTRACT

A technique for forming a sub-0.05 $\mu$m channel length double-gated/double channel MOSFET structure having excellent short-channel characteristics as well as the double-gated/double channel MOSFET structure itself is provided herein. The inventive technique utilizes a damascene process for the fabrication of a MOSFET device with double-gate/double channel structure. The gates are present on opposite sides of a silicon film having a vertical thickness of about 80 nm or less which is present in the gate region. The silicon film serves as the vertical channel regions of the structure and connects diffusion regions that are abutting the gate region to each other. In the inventive device, the current is double that of a conventional planar MOSFET with the same physical width due to its dual channel feature.

19 Claims, 8 Drawing Sheets

DAMASCENE DOUBLE-GATE MOSFET WITH VERTICAL CHANNEL REGIONS

This application is a divisional application of U.S. application Ser. No. 09/866,023, filed May 24, 2001, now U.S. Pat. No. 6,635,923.

FIELD OF THE INVENTION

The present invention relates to semiconductor devices, and more particularly to a method of fabricating a double-gated metal oxide semiconductor field effect transistor (MOSFET) structure that has sub-0.05 $\mu$m channel lengths associated therewith. The present invention also relates to a double-gated MOSFET structure having vertical channel regions. The structure of the inventive MOSFET comprises a silicon film having a vertical thickness of about 80 nm or less which forms the vertical body, i.e., vertical channels, of the structure.

BACKGROUND OF THE INVENTION

Over the past twenty-five years or so, the primary challenge of very large scale integration (VLSI) has been the integration of an ever-increasing number of MOSFET devices with high yield and reliability. This was achieved mainly in the prior art by scaling down the MOSFET channel length without excessive short-channel effects. As is known to those skilled in the art, short-channel effects are the decrease of threshold voltage $V_t$ in short-channel devices due to two-dimensional electrostatic charge sharing between the gate and the source/drain regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 $\mu$m MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of the prior art MOSFETs consists of a very thin insulating layer for the channel, with two gates, one on each side of the channel. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

To date, there are no adequate means for fabricating double-gated MOSFET structures, thus there is a continued need for developing a new and improved method of fabricating double-gated MOSFETs in which the variation of the threshold voltage with drain voltage and with gate length is substantially less than that of a single-gated structure of the same channel length. Moreover, there is a continued need for developing a method of fabricating a double-gated structure having an on-current that is double that of a single-gated structure with the same channel length.

SUMMARY OF THE INVENTION

One object of the present invention is to provide a method of fabricating a double-gated/double channel MOSFET structure that has sub-0.05 $\mu$m channels length associated therewith.

Another object of the present invention is to provide a method of fabricating a double-gated/double channel MOSFET structure that has excellent short-channel characteristics.

A further object of the present invention is to provide a method of fabricating a double-gated/double channel MOSFET structure in which the variation of threshold voltage with drain voltage and with gate length is substantially less than that of a single-gated structure of the same channel length.

A yet further object of the present invention is to provide a method of fabricating a double-gated/double channel MOSFET structure which has double the on-current as compared with conventional single-gated structures of the same channel length.

These and other objects and advantages are achieved in the present invention by utilizing a damascene process for the fabrication of a MOSFET structure with a double-gated/double channel structure; the gate of the inventive device is located on each side of a silicon film having a vertical thickness, i.e., height, on the order of about 80 nm or less. The silicon film, which is formed on top of an insulating region, functions as the vertical channel regions of the MOSFET structure and it is surrounded with a gate forming a MOSFET structure with two parallel channels and a single-gate.

Short-channel effects are greatly reduced with sub-0.05 $\mu$m channel lengths because the device body, i.e., channel regions, has a very thin horizontal thickness which allows the termination of the drain field lines on the surrounding gate. This, in turn, prevents the drain potential from being felt at the source end of the channel. The current of the inventive structure is double that of a conventional planar MOSFET with the same physical channel length due to its dual channel feature.

One aspect of the present invention thus relates to a method of fabricating a double-gated/double channel MOSFET structure having sub-0.05 channel lengths, said method comprising the steps of:

(a) forming a patterned hard mask on a surface of a substrate, said substrate comprising at least a silicon layer formed on top of an insulating region;

(b) forming a patterned dummy gate stack on a portion of said silicon layer and a portion of said patterned hard mask;

(c) forming source/drain extensions by removing said silicon layer not protected by said hard mask and said patterned dummy gate stopping on said insulating region and oxidizing exposed sidewalls of said silicon layer protected by said hard mask and said patterned dummy gate region;

(d) forming an oxide layer on exposed surfaces of said insulating region and planarizing said oxide layer stopping on an uppermost polysilicon surface of said patterned dummy gate;

(e) removing said patterned dummy gate stopping on said hard mask so as to provide an opening in said oxide layer;

(f) forming a gate stack in said opening; and (g) removing said oxide layer and said hard mask abutting said gate stack so as to expose said insulating region and portions of said silicon layer abutting said gate stack.

In the above-described method, the silicon layer that remains under the hard mask in the opening provided in step (e) represents the vertical channel regions of the inventive double-gated/double channel MOSFET structure.

Following step (g) above, the present invention also contemplates one or more of the following steps:

- forming activated source/drain regions in portions of said exposed silicon layer abutting said gate stack.
- subjecting said gate stack to oxidation (required if the gate stack comprises polysilicon).
- forming spacers on exposed sidewalls of said gate stack (optional for polysilicon-containing gate stacks, but required for non-polysilicon gate stacks).
- saliciding said source/drain regions, or forming raised source/drain regions on portions of said exposed silicon layer abutting the gate stack and then saliciding the raised source/drain regions.
- further back-end-of the line (BEOL) processing.

Another aspect of the present invention comprises a double-gated/double channel MOSFET structure which is formed from the above-mentioned processing steps. Specifically, the inventive double-gated/double channel MOSFET structure comprises:

- a bottom Si-containing layer;
- an insulating region present on said bottom Si-containing layer;
- a top silicon layer present on a portion of said insulating region, wherein a portion of said top silicon layer functions as vertical channel regions and other portions of said top silicon layer abutting said vertical channel regions contain diffusion regions therein;
- a hard mask formed on top of said vertical channel regions; and
- a gate region formed surrounding said vertical channel regions, wherein said gate region includes at least a gate oxide formed on exposed sidewalls of said vertical channel regions.

DETAILED DESCRIPTION OF THE INVENTION

Figure 1:
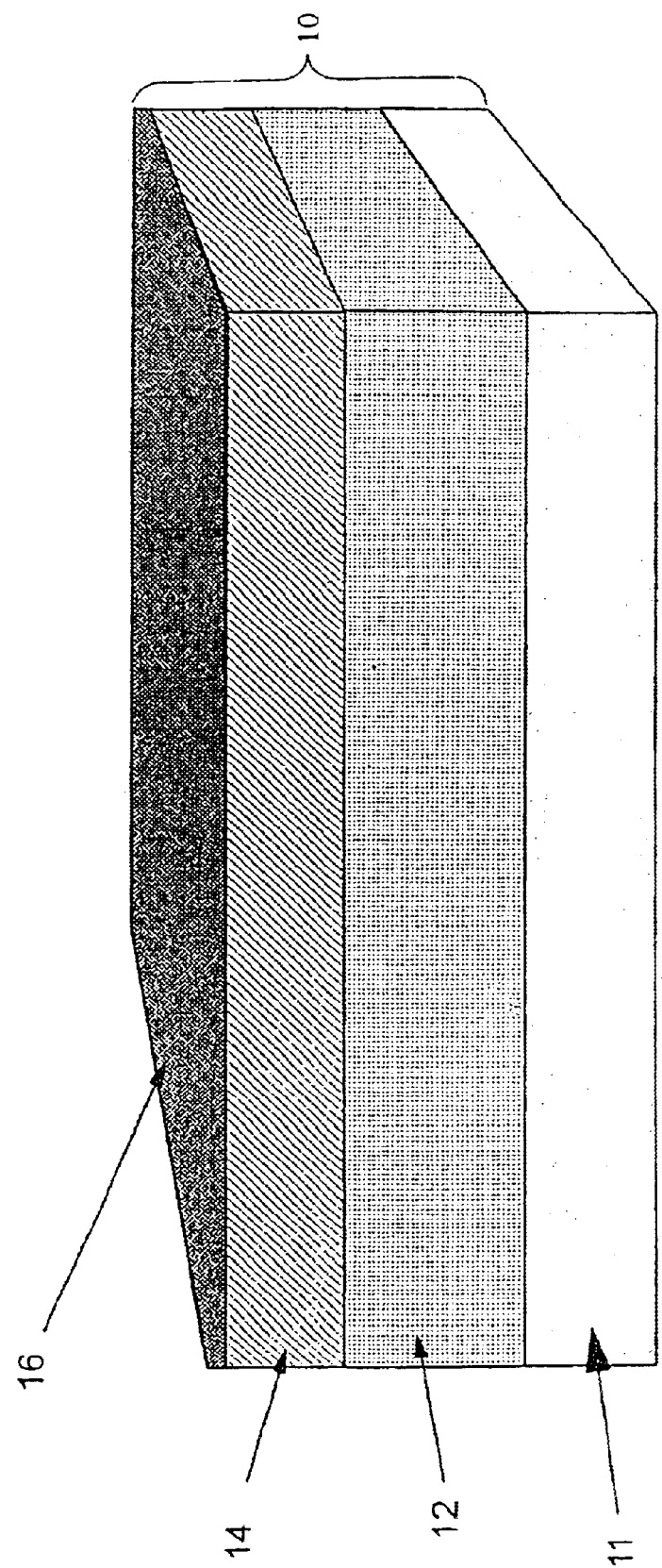
FIGS. 1–8 show the formation of the inventive double-gated/double channel MOSFET structure through various processing steps of the present invention.

The present invention, which relates to a method of fabricating a double-gated/double channel MOSFET structure as well as the MOSFET structure itself, will now be described in more detail by referring to the drawings that accompany the present application. It is noted that in the accompanying drawings, like and/or corresponding elements are referred to by like reference numerals.

Reference is first made to FIG. 1 which illustrates an initial structure that is employed in the present invention in fabricating the inventive double-gated/double channel MOSFET structure. Specifically, the initial structure shown in FIG. 1 comprises a substrate 10 having hard mask 16 formed on an upper surface thereof. The substrate shown in FIG. 1 comprises a bottom Si-containing layer 11, an insulating region 12 present on layer 11, and silicon layer 14 present on insulating region 12.

The initial structure shown in FIG. 1 is composed of conventional materials well known in the art and conventional processing techniques also well known in the art are employed in forming the same. For example, the substrate may be a silicon-on-insulator (SOI) wafer in which insulating region 12 is a buried oxide layer which is sandwiched between a silicon layer (i.e., silicon layer 14 of FIG. 1) and a bottom Si-containing layer (i.e., layer 11 shown in FIG. 1), or alternatively, the substrate includes a Si-containing wafer in which a thin oxide layer, i.e., insulating region 12, is formed between a lightly doped silicon top layer, i.e., silicon layer 14, and a heavily doped bottom Si-containing layer (i.e., layer 11 shown in the FIG. 1); the heavily doped bottom Si-containing layer is the ground plane region of the substrate. Note that in the case of a ground plane substrate, the insulating region depicted in FIG. 1 would be much thinner than that shown. The term "Si-containing" as used herein denotes a material such as Si, SiGe, SiGeC, SiC, polysilicon (i.e., polySi), epitaxial silicon (i.e., epi-Si), amorphous silicon (a:Si), multilayers thereof or other like Si-containing materials.

In accordance with the present invention, top silicon layer 14 is a thin silicon layer which has a vertical thickness, $t_v$, i.e., height, of from about 20 to about 80 nm, with a vertical thickness of about 50 nm being more highly preferred. The thickness of insulating region 12 and the underlying Si-containing layer is not critical to the present invention; however, when a ground plane substrate is employed, the insulating region typically is thinner than the corresponding insulating layer of an SOI substrate.

When an SOI substrate is employed in the present invention, the SOI substrate is fabricated using techniques that are well known in the art. For example, the SOI substrate may be fabricated by a thermal bonding process, or alternatively the SOI substrate may be formed by an implantation process which is referred to in the art as separation by ion implantation of oxygen (SIMOX).

When the substrate includes a ground plane region, the substrate containing the ground plane region is formed by conventional bonding processes well known in the art and doping of the Si layers is carried out utilizing conventional ion implantation.

Notwithstanding the type of substrate employed in the present invention, hard mask 16 is formed on a surface of silicon layer 14 of substrate 10 utilizing conventional processes well known in the art. For example, the hard mask may be formed by a conventional deposition process such as chemical vapor deposition (CVD), plasma-assisted CVD, evaporation, sputtering, atomic layer deposition, chemical solution deposition, or alternatively, the hard mask is formed by a conventional thermal growing process such as oxidization, nitridation or oxynitridation. Of these techniques mentioned hereinabove, it is highly preferred that bard mask 16 be formed by a thermal growing process.

The hard mask employed in the present invention is composed of an insulating material such as an oxide, nitride, oxynitride, or combinations thereof. A highly preferred material for hard mask 16 is an oxide such as $SiO_2$. In accordance with the present invention, a layer of hard mask material is formed on the uppermost surface of substrate 10. The layer of hard mask material employed in the present invention has a physical thickness of from about 30 to about 70 nm, with a physical thickness of about 50 nm being more highly preferred.

Following the formation of the layer of hard mask material on the uppermost surface of the substrate, the layer of hard mask 16 is then patterned so as to form patterned hard mask 18 on a portion of silicon layer 14; See FIG. 2. Although only one patterned hard mask region is depicted in drawings of the present application, the present invention works equally well when more than one patterned hard mask region is formed on the uppermost surface of substrate 10. Note that in FIG. 2, layer 11 has been omitted for clarity.

Figure 2:
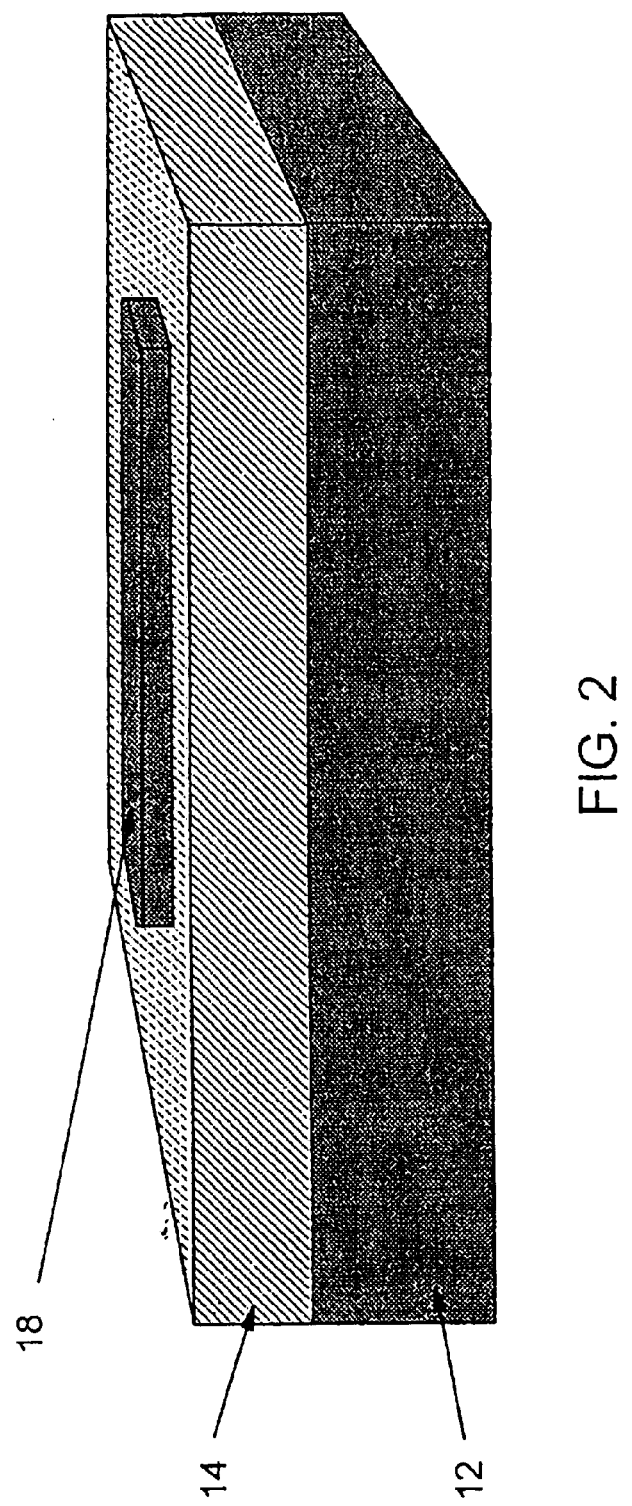

Patterned hard mask 18 is formed on portions of silicon layer 14 by utilizing lithography and etching. The lithography step employed in this patterning process includes applying a photoresist (not shown in the drawings) to a surface of hard mask 16, exposing said photoresist to a pattern of radiation and developing the pattern in the exposed photoresist by employing a conventional developer solution. The pattern is then transferred to the hard mask by employing a conventional etching process such as reactive-ion etching (RIE), plasma etching, ion beam etching or other like etching processes and following the etching step, the patterned resist is stripped providing patterned hard mask 18 such as shown in FIG. 2.

Figure 3:
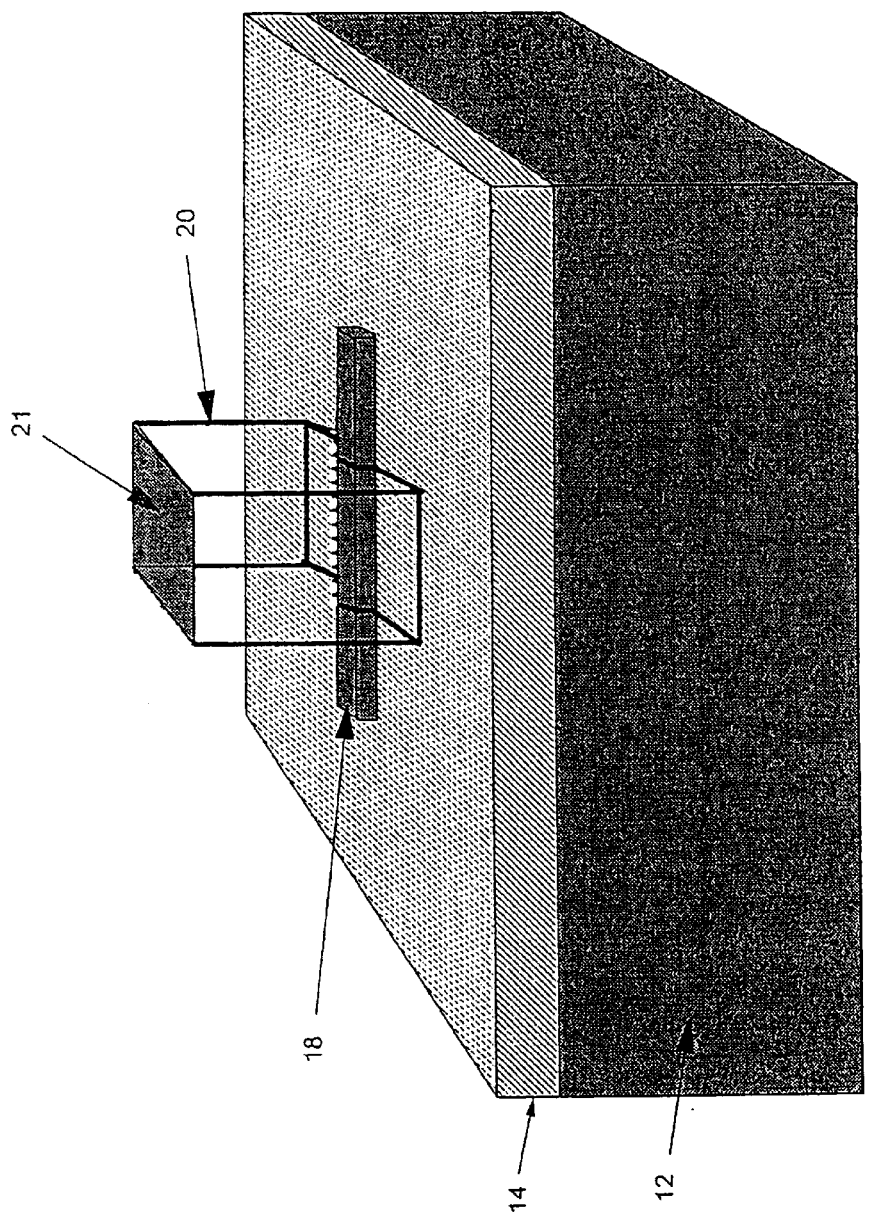

A dummy gate stack 20 is then formed on portions of patterned hard mask 18 and portions of silicon layer 14 so as to provide the structure shown in FIG. 3. Specifically the structure shown in FIG. 3 is formed by first depositing a layer of polysilicon on the surface of the structure shown in FIG. 2. The layer of polysilicon is formed by a conventional deposition process such as CVD, plasma-assisted CVD, evaporation, sputtering, atomic layer deposition, or chemical solution deposition.

Since this polysilicon layer is employed as a dummy gate material, the thickness of the polysilicon formed at this step of the present invention should be at least as thick as that of the desired gate region to be subsequently formed. Specifically, the thickness of the polysilicon material employed at this point of the present invention is from about 100 to about 200 nm, with a thickness of from about 120 to about 180 nm being more highly preferred.

An oxide layer having a thickness of about 50 nm is then formed on a portion of uppermost surface of the polysilicon layer which lies on top of portions of pattern hard mask 18. The oxide layer may be formed utilizing a conventional deposition process such as CVD, or a conventional oxidation process may be employed in forming the same. After forming the oxide layer, the oxide layer is patterned utilizing conventional lithography and etching forming hard mask 21 on the surface of the polysilicon layer. Note that the hard mask is used in the formation of the patterned dummy gate region.

Following the formation of hard mask 21 on the structure, the exposed portions of the polysilicon not containing hard mask 21 is patterned by etching through those regions of the polysilicon layer that do not include the protective oxide layer thereon so as to form patterned dummy gate 20 shown in FIG. 3. Note that the patterned dummy gate is formed on portions of the patterned hard mask and portions of the silicon layer.

Figure 4:
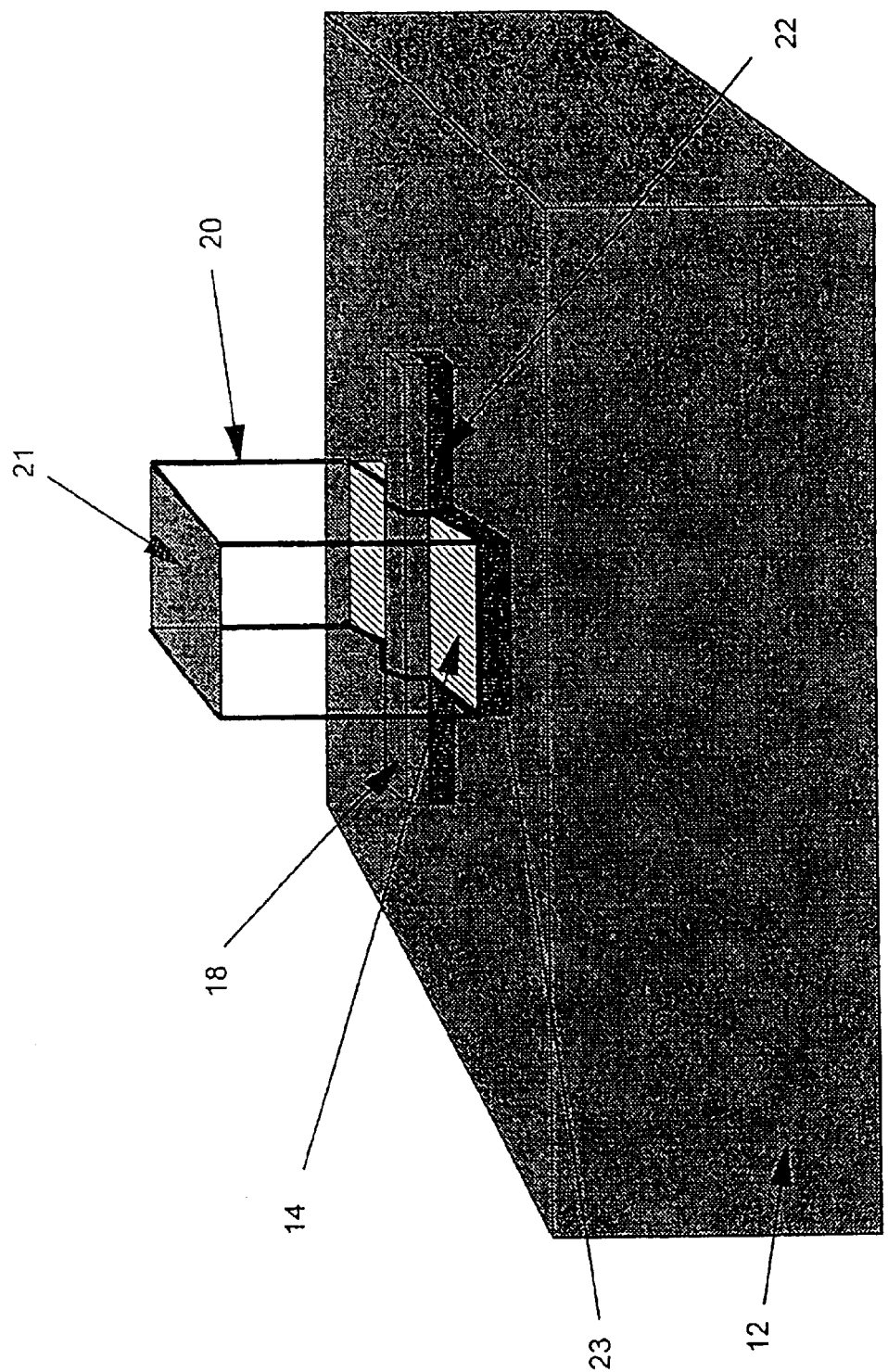

Following patterning of the dummy gate region, the structure shown in FIG. 3 is subjected to a removal step in which the exposed portions of silicon layer 14, not covered by dummy gate 20 and patterned hard mask 18, are removed utilizing a conventional dry etching process such as RIE which is capable of stopping on the underlying insulating region (i.e., insulating region 12 of substrate 10). Note that the removal process employed at this junction of the present invention maintains a portion of the silicon layer that is protected by the patterned hard mask and the patterned dummy gate. The remaining silicon has exposed sidewalls which are then subjected to a conventional oxidation process which results in the formation of source/drain extension regions 22 that abut the patterned dummy gate region, and pad oxide region 23 that underlies dummy gate 20, See FIG. 4.

The oxidation process employed in the present invention includes any conventional sidewall oxidation process that is performed at a temperature of about 700° C. or above in an oxygen-containing atmosphere. More preferably, the sidewall oxidation process is performed at a temperature of from about 800° to about 900° C. The duration of the sidewall oxidation step employed in the present invention is not critical and thus may vary within ranges that are well known to those skilled in the art.

Figure 5:
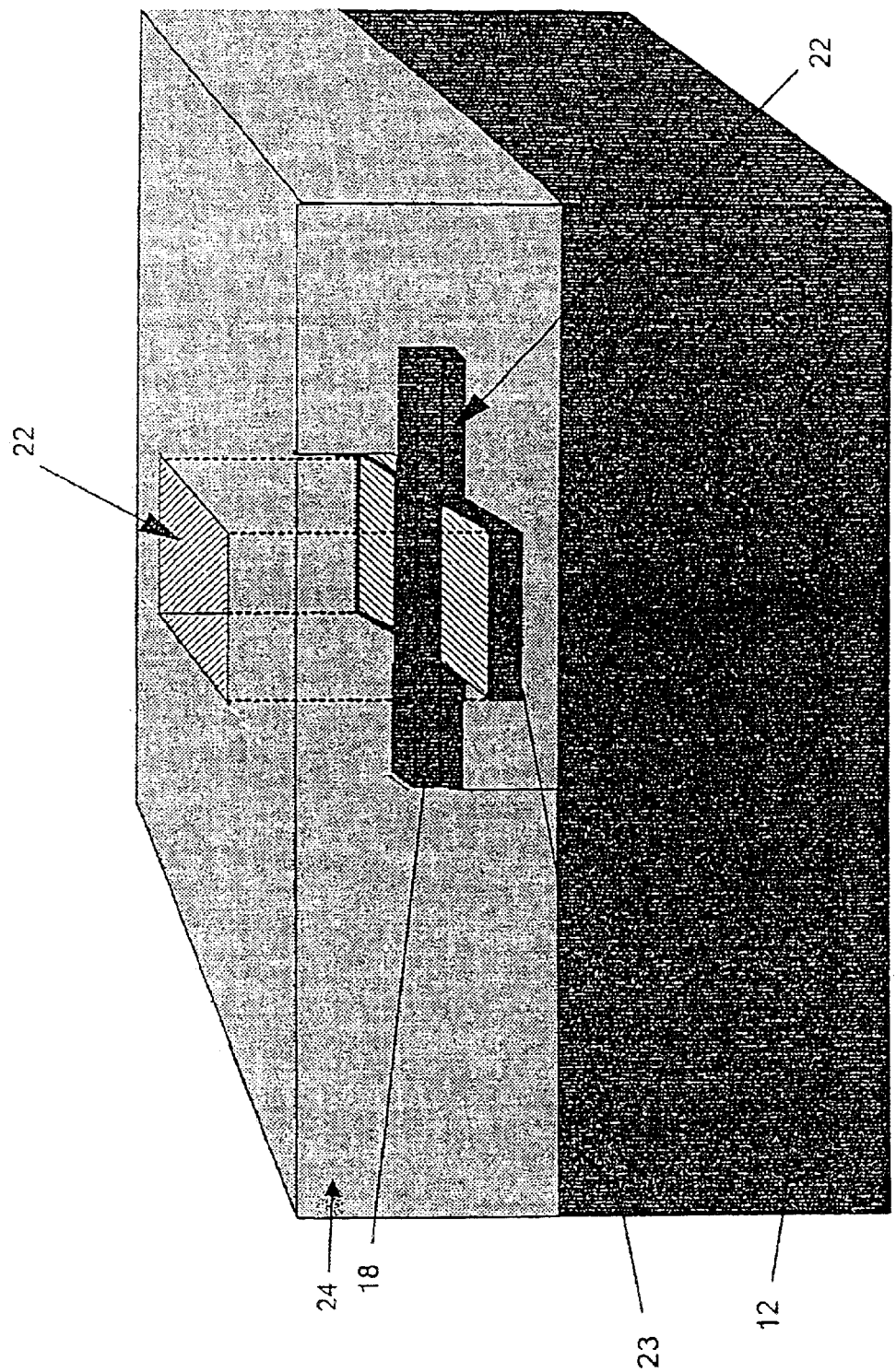

FIG. 5 shows the resultant structure that is obtained after planarized oxide layer 24 is formed in the structure. Specifically, planarized oxide layer 24 is formed by first depositing an oxide layer over all exposed surfaces of the structure shown in FIG. 4 and thereafter planarizing the deposited layer down to the uppermost polysilicon surface of dummy gate region 20. Note that the top protective oxide layer is removed during the planarization step. The oxide layer formed in this step of the present invention may be comprised of TEOS (tetraethylorthosilicate) which is deposited by a conventional low-pressure CVD process or other like materials that are formed by conventional deposition processes.

The planarization process employed in this step of the present invention includes any conventional planarization technique such as chemical-mechanical polishing (CMP) or grinding. It is noted that the oxide material employed as layer 24 has an etch rate that is less than the dummy gate polysilicon so that the next step of the present invention can be performed.

Figure 6:
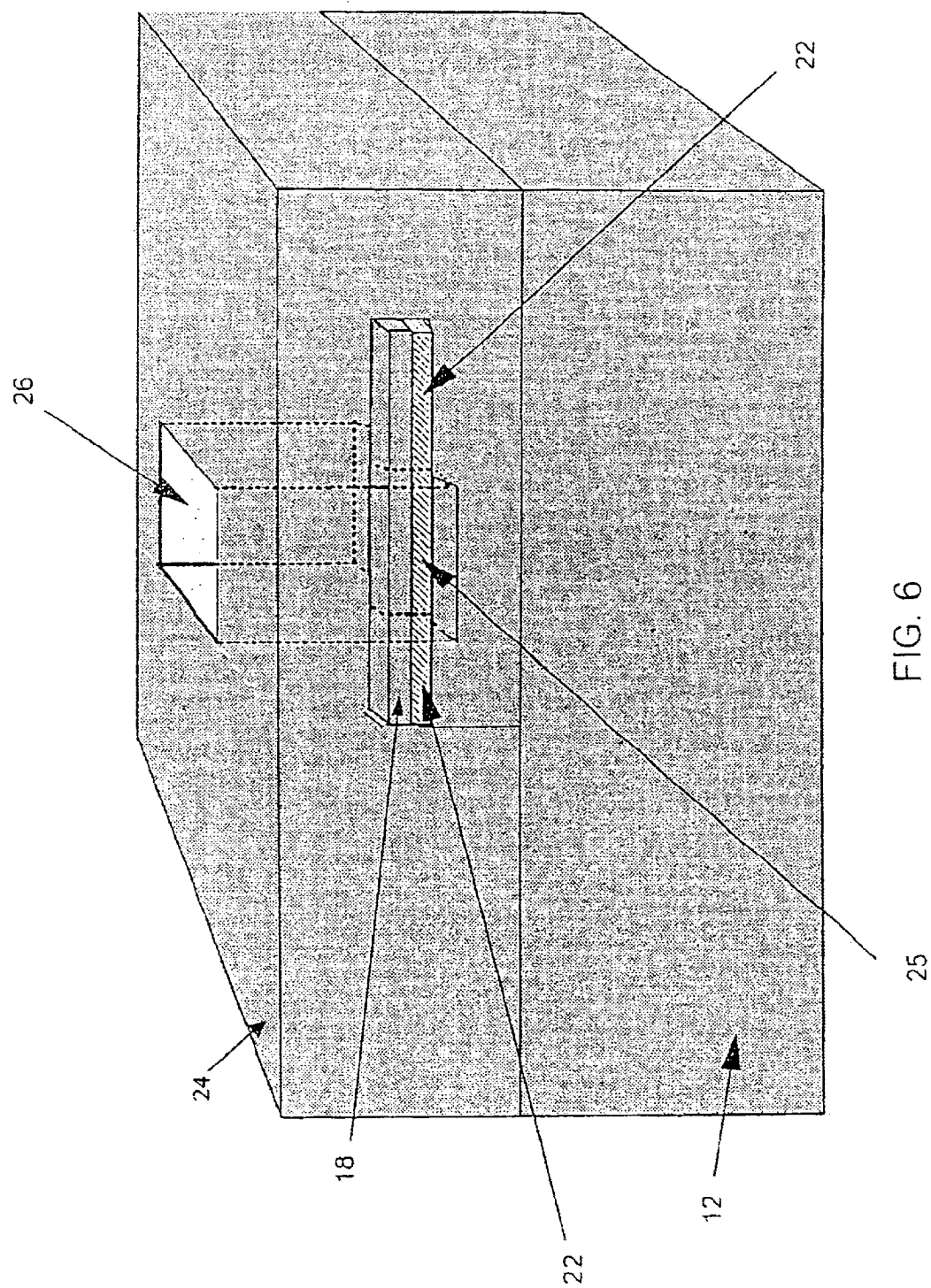

The next step of the present invention, which is shown, for example, in FIG. 6, includes selectively removing dummy gate region 20 so as to provide opening 26 which extends down to the top surface of patterned hard mask 18. Note that during this step of the present invention, silicon layer 14 beneath the dummy gate polysilicon that is not protected by the patterned hard mask is also removed. In accordance with the present invention, the dummy gate region and silicon layer 14 beneath the dummy gate polysilicon not protected by the hard mask are removed by a conventional dry etching process such as RIE, plasma-etching or ion beam etching. Note that this step of the present invention results in the formation of channel regions within the remaining silicon layer 14 that is present on top of insulating region 12. In FIG. 6, reference numeral 25 denotes one of the vertical channel regions of the inventive structure. Note that the vertical channel regions are composed of thin silicon layer 14 which is present atop of insulating region 12.

Nitride or other insulating spacers (not shown) may be optional formed in the opening at this point of the inventive process utilizing conventional deposition processes well known to those skilled in the art. The spacers are preferably employed in cases wherein extremely small channel lengths are desirable.

Figure 7:
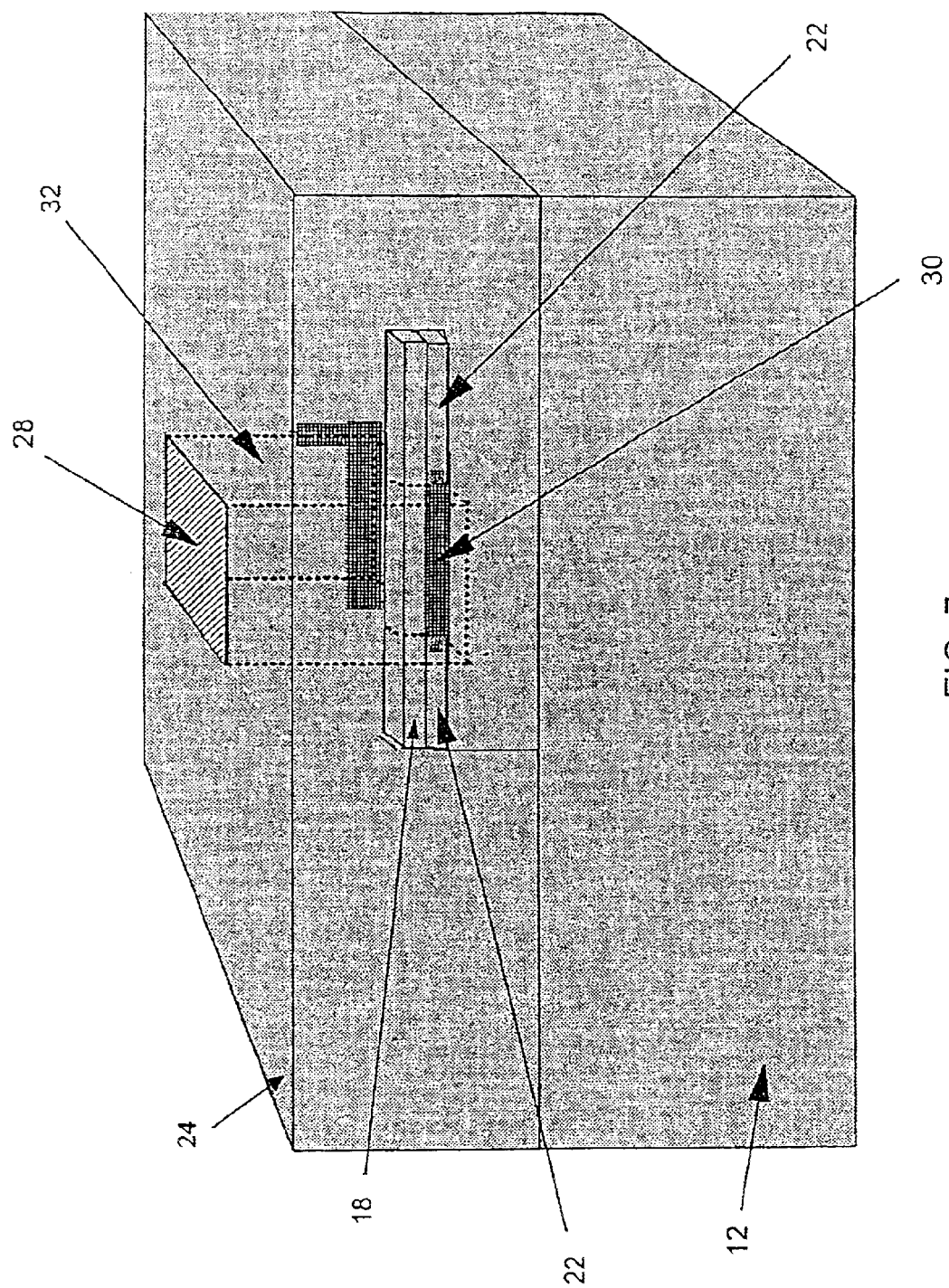

Next, a gate stack 28 is formed within the opening providing the structure shown in FIG. 7. The formation of gate stack 28 includes the steps of: forming gate oxide 30 on exposed sidewalls of the remaining silicon layer 14 that lies beneath the patterned hard mask within opening 26, filling said opening with gate conductor 32 and planarizing to planarized oxide layer 24. Specifically, the gate oxide is formed by utilizing a conventional sidewall oxidation process as mentioned above, or the gate oxide may be formed by a deposition process such as CVD.

The gate conductor-filling step employed in the present invention includes the use of any conventional deposition process such as CVD, plasma-assisted CVD, sputtering, plating, evaporation, atomic layer deposition or chemical solution deposition. Gate conductor 32 employed in the present invention includes any conductive material, including, but not limited to: polysilicon, elemental metals such as Cu, W, Pt, Ag, Au, Ru, Re, and alloys, silicates or oxynitrides of these elemental metals. A highly preferred conductive material employed in the present invention is polysilicon.

CMP or another like planarization process may be employed in forming the planarized structure shown in FIG. 7.

When polysilicon is employed as the gate conductor, the planarized structure containing the polysilicon gate conductor region may be subjected to a conventional ion implantation step so as to implant dopant ions (n-type or p-type) in the polysilicon gate conductor and thereafter a conventional annealing process may be employed which serves to diffuse and activate the dopant ions within the polysilicon gate conductor. Note this step may be omitted, if the polysilicon layer is formed within the opening utilizing a conventional in-situ doping deposition process.

After forming the gate region within the opening, planarized oxide layer 24 as well as patterned hard mask 18 not within the gate region are removed utilizing a conventional etching process which selective removes oxide as compared to gate conductor. Specifically, this etching process of the present invention includes a wet etch process wherein a chemical etchant such as HF is employed. The resultant structure after removing the oxide layers is shown, for example, in FIG. 8.

Figure 8:
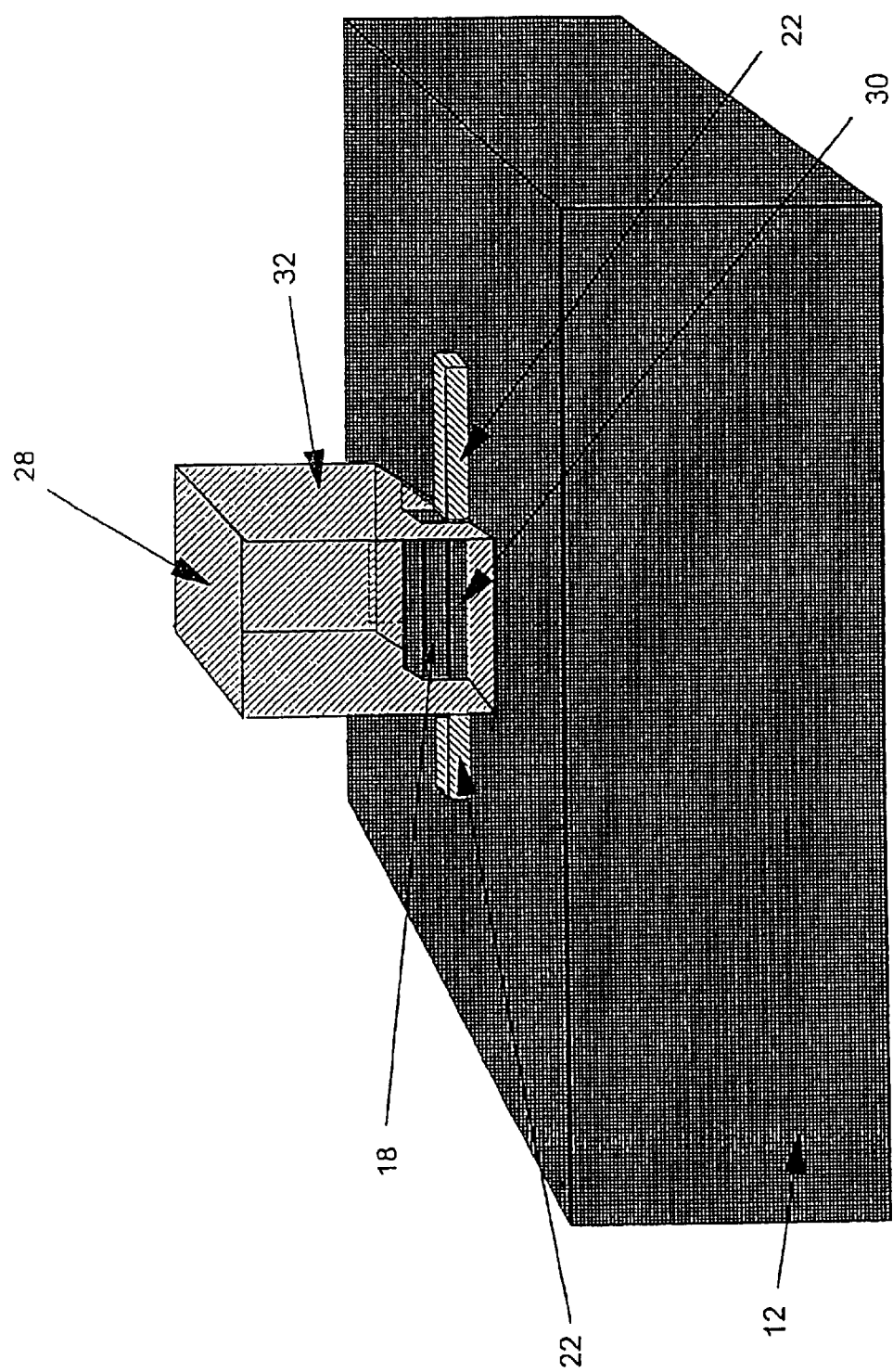

After removing the oxide layers from the structure, the structure shown in FIG. 8 may be subjected to one or more of the following additional processing steps: (i) forming activated diffusion (source/drain) regions in portions of said exposed silicon layer abutting said gate stack; (ii) subjecting the gate stack to oxidation (required if the gate stack comprises polysilicon); (iii) forming spacers on exposed sidewalls of said gate stack (optional for polysilicon-containing gate stacks, but required for non-polysilicon gate stacks); (iv) saliciding said source/drain regions, or forming raised source/drain regions via selective Si deposition and then saliciding the raised source/drain regions; and (v) further back-end-of the line (BEOL) processing.

Each of the above mentioned additional processing steps include techniques that are well known in the art. For example, activated source/drain regions are formed by ion implantation and annealing; poly gate oxidation is carried out utilizing a conventional sidewall oxidation process; insulating, e.g. nitride, spacers are formed by deposition and etching; source/drain salicidation is performed by depositing a refractory metal such as Ti, Co, or W on the source/drain regions utilizing a conventional deposition process well known in the art and thereafter the same is annealed under conditions whereby a refractory metal silicide such as $TiSi_2$ is formed over the diffusion regions.

It is noted that when polysilicon gate conductors are employed, a problem of high "off" current may exist due to the work function of the polysilicon gate and the very thin body of the device. This problem can be alleviated in the present invention by switching to the other conductors mentioned herein, or by using a substrate that contains a ground plane that can adjust threshold voltage. In cases wherein a ground plane is employed it may be necessary to form a reach-through implant in the substrate which provides a connection from the outer surface of the structure to the underlying heavily doped Si-containing layer.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the present invention.

What is claim is:

1. A method of fabricating a double-gated/double channel metal oxide semiconductor field effect transistor (MOSFET) device having sub-0.05 channel lengths, said method comprising the steps of:
   (a) forming a patterned hard mask on a surface of a substrate, said substrate comprising at least a silicon layer formed on top of an insulating region;
   (b) forming a patterned dummy gate stack including a polysilicon layer on a portion of said silicon layer and a portion of said patterned hard mask;
   (c) fanning source/drain extensions by removing said silicon layer not protected by said patterned hard mask and said patterned dummy gate stack to expose said insulating region and oxidizing exposed sidewalls of said silicon layer protected by said patterned hard mask and said patterned dummy gate stack;
   (d) forming an oxide layer on exposed surfaces of said insulating region and planarizing said oxide layer to expose an uppermost surface of said polysilicon layer;
   (e) removing said exposed polysilicon layer to provide an opening that extends to a top surface of said patterned hard mask;
   (f) forming a gate stack in said opening; and
   (g) removing said oxide layer and said patterned hard mask abutting said gate stack exposing said insulating region and portions of said silicon layer abutting said gate stack, thereby providing a double-gated/double channel MOSFET structure including said top silicon layer having a vertical thickness on the order of about 80 mn or less and vertical channel regions having a length of less than 0.05 microns located on each side of said top silicon layer, and said gate stack surrounding said vertical channel regions.

2. The method of claim 1 wherein step (a) comprises the steps of:
   depositing a hard mask material on said surface of said substrate; applying a photoresist to a surface of said hard mask; exposing said photoresist to a pattern of radiation; developing the pattern in said photoresist and transferring said patterned to said hard mask material via etching.

3. The method of claim 2 wherein said etching comprises reactive-ion etching.

4. The method of claim 1 wherein step (b) comprises the steps of deposition said polysilicon layer; forming a protective oxide layer on a portion of said polysilicon layer; and etching polysilicon not protected by said protective oxide layer.

5. The method of claim 1 wherein said removing step of step (c) comprises a reactive-ion etching process.

6. The method of claim 1 wherein said oxidizing step of step (c) is performed at a temperature of about 700° C. or above in an oxygen-containing atmosphere.

7. The method of claim 6 wherein said oxidizing step is performed at a temperature of from about 800° to about 900° C.

8. The method of claim 1 wherein said oxide layer employed in step (d) is comprised of TEOS that is deposited by a low-pressure chemical vapor deposition process.

9. The method of claim 1 wherein step (e) comprises a reactive-ion etching process.

10. The method of claim 1 wherein step (f) comprises forming a gate oxide in said opening on exposed sidewalls of said remaining silicon layer; filling said opening with a gate conductor; and planarizing said gate conductor.

11. The method of claim 10 wherein said gate oxide is formed by a thermal oxidation process.

12. The method of claim 10 wherein said filling step comprises deposition process selected from the group consisting of chemical vapor deposition, plasma-assisted chemical vapor deposition, sputtering, plating, evaporation, atomic layer deposition and chemical solution deposition.

13. The method of claim 10 wherein said gate conductor is polysilicon.

14. The method of claim 13 wherein said polysilicon is doped by ion implantation and annealing.

15. The method of claim 1 wherein step (g) comprises a wet etch process wherein HF is employed as a chemical etchant.

16. The method of claim 1 further comprising the step of forming activated diffusion regions in portions of said exposed silicon layer abutting said gate stack.

17. The method of claim 1 further comprising subjecting said gate stack to an oxidation process.

18. The method of claim 1 further comprising forming spacers on exposed sidewalls of said gate stack.

19. The method of claim 16 further comprising saliciding said diffusion regions.

* * * * *

UNITED STATES PATENT AND TRADEMARK OFFICE
CERTIFICATE OF CORRECTION

PATENT NO. : 6,835,614 B2
DATED : December 28, 2004
INVENTOR(S) : Hussein I. Hanafi et al.

It is certified that error appears in the above-identified patent and that said Letters Patent is hereby corrected as shown below:

Column 8,
Line 22, "fanning" should read -- forming --

Signed and Sealed this

Seventh Day of June, 2005

JON W. DUDAS
*Director of the United States Patent and Trademark Office*